United States Patent
Chen et al.

(10) Patent No.: US 9,584,084 B2
(45) Date of Patent: Feb. 28, 2017

(54) AUDIO OUTPUT DEVICE AND CONTROL METHOD

(71) Applicant: Wistron Corporation, New Taipei (TW)

(72) Inventors: Jing-Lungmr Chen, New Taipei (TW); Po-Cheng Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/794,831

(22) Filed: Jul. 9, 2015

(65) Prior Publication Data

US 2016/0181998 A1    Jun. 23, 2016

(30) Foreign Application Priority Data

Dec. 18, 2014  (TW) .............................. 103144374 A

(51) Int. Cl.
  *H03G 3/20*   (2006.01)
  *H03G 3/30*   (2006.01)
  *H03G 7/00*   (2006.01)

(52) U.S. Cl.
  CPC ............. *H03G 3/20* (2013.01); *H03G 3/3005* (2013.01); *H03G 7/002* (2013.01)

(58) Field of Classification Search
  None
  See application file for complete search history.

(56) References Cited

U.S. PATENT DOCUMENTS

| | | | |
|---|---|---|---|
| 5,001,774 A * | 3/1991 | Lee ........................... | H03G 1/02 348/734 |
| 6,826,515 B2 * | 11/2004 | Bernardi ................... | G01H 3/14 379/387.01 |
| 7,003,123 B2 | 2/2006 | Kanevsky | |
| 2007/0214893 A1 * | 9/2007 | Killion ...................... | G01H 3/14 73/648 |
| 2007/0274531 A1 * | 11/2007 | Camp ....................... | H04R 5/04 381/74 |

FOREIGN PATENT DOCUMENTS

| TW | I291647 | 12/2007 |
|---|---|---|
| TW | I300185 | 8/2008 |

OTHER PUBLICATIONS

Office action mailed on Mar. 16, 2016 for the Taiwan application No. 103144374, filing date: Dec. 18, 2014, p. 2 line 2~26, p. 3 and p. 4 line 1~17.

* cited by examiner

*Primary Examiner* — Paul Huber
(74) *Attorney, Agent, or Firm* — Winston Hsu; Scott Margo

(57) ABSTRACT

An audio output device includes a voltage detection unit, a processing unit, a voltage detection unit, an alarm unit and an audio output unit. The voltage detection unit is utilized for detecting a voltage level of an audio signal to generate a detection result. The processing unit is utilized for determining whether the voltage level of the audio signal is greater than a threshold value according to the detection result and accordingly generating a control signal. The volume adjustment unit is utilized for adjusting the audio signal to generate an adjusted audio signal according to the control signal. The alarm unit is utilized for outputting a first alarm signal to implement an alarm function according to the control signal. Then audio output unit is utilized for playing the adjusted audio signal according to the control signal.

13 Claims, 2 Drawing Sheets

AUDIO OUTPUT DEVICE AND CONTROL METHOD

BACKGROUND OF THE INVENTION

1. Field of the Invention

The present invention relates to an audio output device and a control method, and more particularly, to an audio output device and a control method capable of adjusting volume of an audio signal and performing alarm functions.

2. Description of the Prior Art

With rapid development of technology, portable electronic devices equipped with multimedia playback functions, such as wearable devices, smart phones, notebooks, tablets, portable audio players, are widely used in the daily life. In general, audio signals can be generated by the portable electronic devices and played back via external audio output devices.

However, the portable electronic device may output an audio signal in an inappropriate volume level since the portable electronic device does not offer proper volume control for the audio signal. So, a user may feel uncomfortable due to a sound of large volume and even suffer from hearing loss or hearing impairment. For example, if a portable audio player provides audio signals at very high volume. As the user wears a pair of headphones and the pair of headphones is connected to the portable audio player, the audio signals may be passed on to the pair of headphones and played at high volume level accordingly. Under such a situation, the user would listen to the audio signal too loud and suffer hearing loss. Thus, the prior art has to be improved.

SUMMARY OF THE INVENTION

It is therefore an objective of the present invention to provide an audio output device and a control method capable of adjusting volume of an audio signal and performing alarm functions for preventing hearing loss.

The present invention provides an audio output device, comprising: a voltage detection unit for detecting a voltage level of an audio signal to generate a detection result; a processing unit for determining whether the voltage level of the audio signal is greater than a threshold value according to the detection result and accordingly generating a control signal; a volume adjustment unit for adjusting the audio signal to generate an adjusted audio signal according to the control signal; an alarm unit for outputting a first alarm signal to implement an alarm function according to the control signal; and an audio output unit for playing the adjusted audio signal according to the control signal.

The present invention further provides a control method for an audio output device, comprising: receiving an audio signal from an audio generating apparatus when the audio output device is connected to the audio generating apparatus; detecting a voltage level of the audio signal to generate a detection result; determining whether the voltage level of the audio signal is greater than a threshold value according to the detection result and accordingly generating a control signal; adjusting the audio signal to generate an adjusted audio signal according to the control signal; outputting a first alarm signal to implement an alarm function according to the control signal; and playing the adjusted audio signal according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
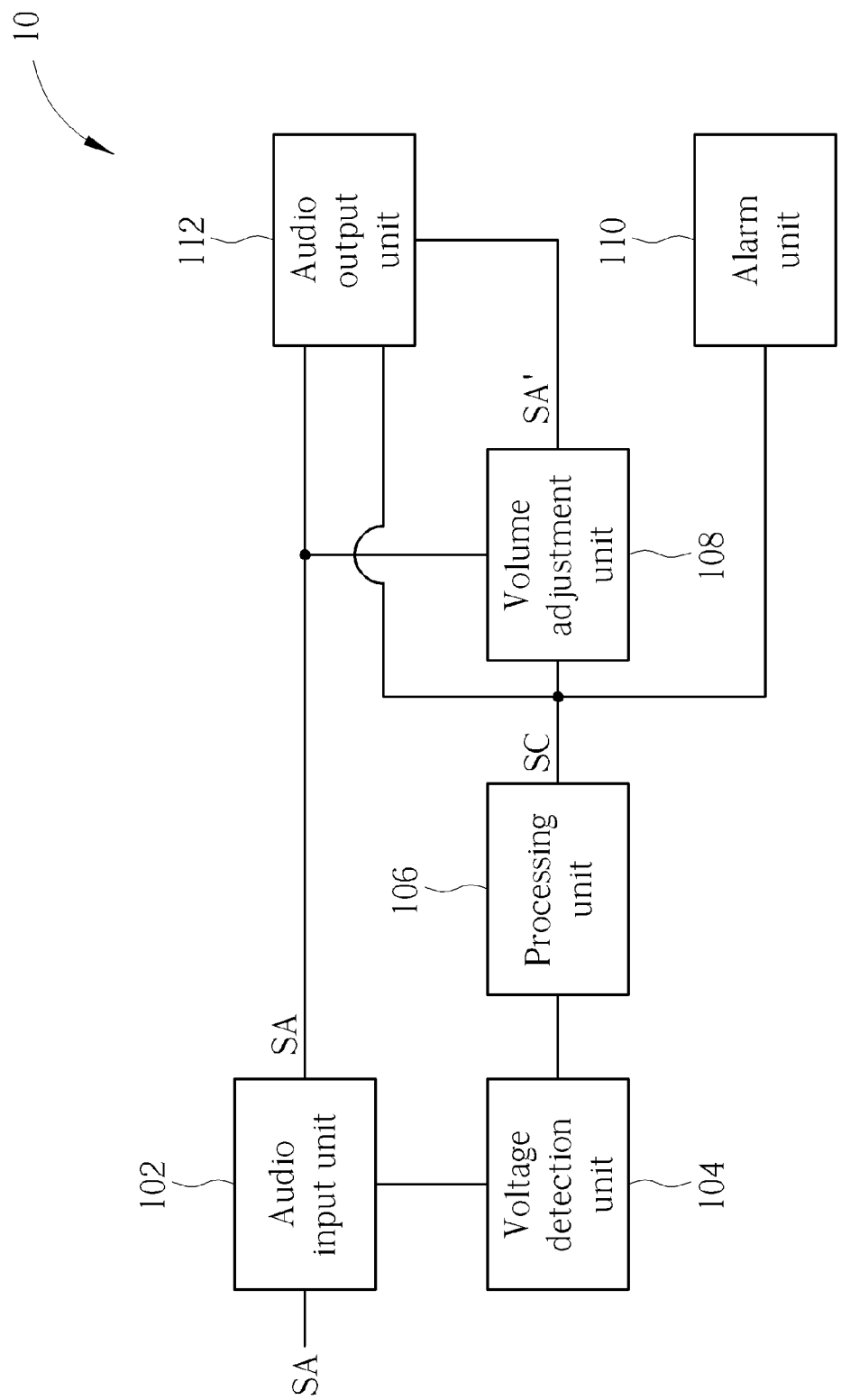
FIG. 1 is a schematic diagram of an audio output device according to an embodiment of the present invention.

Please refer to FIG. 1, which is a schematic diagram of an audio output device 10 according to an embodiment of the present invention. The audio output device 10 may be a headphone or a speaker, and is not limited herein. The audio output device 10 includes an audio input unit 102, a voltage detection unit 104, a processing unit 106, a volume adjustment unit 108, an alarm unit 110 and an audio output unit 112. The audio input unit 102 is utilized for receiving an audio signal SA when the audio output device 10 is connected to an audio generating apparatus (not shown in figures). The voltage detection unit 104 is utilized for detecting a voltage level of the audio signal SA to generate a detection result. The processing unit 106 is utilized for determining whether the voltage level of the audio signal SA is greater than a threshold value TH according to the detection result and generating a control signal SC accordingly, so as to control operations of the volume adjustment unit 108, the alarm unit 110 and/or the audio output unit 112. The volume adjustment unit 108 is utilized for adjusting the audio signal SA to generate an adjusted audio signal SA' according to the control signal SC. The audio output unit 112 is utilized for playing the audio signal SA or adjusted audio signal SA' according to the control signal SC. The alarm unit 110 is utilized for outputting alarm signals to implement alarm functions according to the control signal SC.

In brief, when the audio output device 10 of the invention connects to the audio generating apparatus and receives the audio signal, the audio output device 10 can detect the volume level of the audio signal and control the volume of the audio signal to fall within an appropriate level range to prevent hearing loss.

Figure 2:
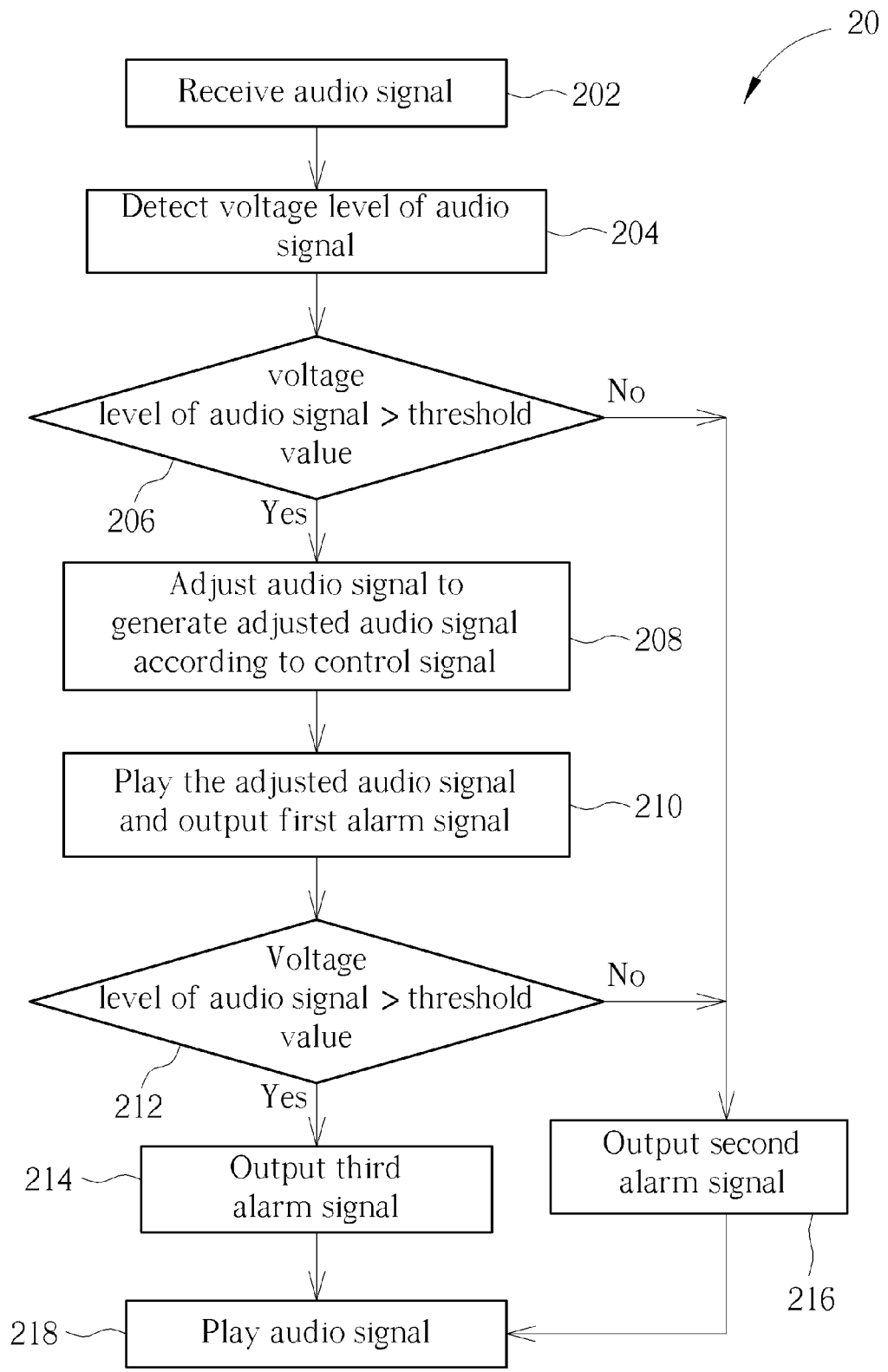
FIG. 2 is a flow diagram of a procedure according to an embodiment of the present invention.

For an illustration of the operations of the audio output device 10, please refer to FIG. 2. FIG. 2 is a flow diagram of a procedure 20 according to an embodiment of the present invention. The flowchart in FIG. 2 mainly corresponds to the operations on the audio output device 10 shown in FIG. 1. According to the procedure 20, the user can utilize the audio output device 10 shown in FIG. 1 to play audio signals transmitted from an audio generating apparatus. In Step 202, the audio output device 10 connects to an audio generating apparatus, wherein the audio output device 10 may connect to the audio generating apparatus in a wired and/or wireless manner. After that, the audio input unit 102 receives the audio signal SA from the audio generating apparatus. In Step 204, the voltage detection unit 104 detects a voltage level of the audio signal SA and accordingly generates a detection result.

In an embodiment, the audio output device 10 has volume control permission when the audio output device 10 receives audio signals. In Step 206, the processing unit 106 determines whether the voltage level of the audio signal SA is greater than a threshold value TH according to the detection result of Step 204 and generates a control signal SC accordingly, to control operations of the volume adjustment unit

108, the alarm unit 110 and/or the audio output unit 112. In other words, the processing unit 106 can compare the voltage level of the audio signal SA with the threshold value TH, so as to generate the control signal SC.

In Step 208, when the control signal SC indicates that the audio output device 10 has the volume control permission and the voltage level of the audio signal SA is greater than the threshold value TH, the volume adjustment unit 108 adjusts the audio signal SA to generate an adjusted audio signal SA' according to the control signal SC generated by the processing unit 106. For example, the volume adjustment unit 108 decreases the voltage level of the audio signal SA to generate the adjusted audio signal SA' for turning down the volume of the audio signal SA and enforcing the volume below a safe level to prevent hearing loss.

Further, the volume adjustment unit 108 includes a variable resistor unit. The variable resistor unit is utilized for adjusting an independence value according to the control signal SC so that the audio signal SA is adjusted to the adjusted audio signal SA'. For example, when the control signal SC indicates that the audio output device 10 has the volume control permission and the voltage level of the audio signal SA is greater than the threshold value TH, the variable resistor unit increases the independence value so as to decrease the voltage level of the audio signal SA and accordingly generate the adjusted audio signal SA', thus turning down the volume of the audio signal.

In Step 210, when the control signal SC indicates that the audio output device 10 has the volume control permission and the voltage level of the audio signal SA is greater than the threshold value TH, the audio output unit 112 plays the adjusted audio signal SA' with decreased volume so that hearing impairment can be prevented accordingly. Moreover, when the control signal SC indicates that the audio output device 10 has the volume control permission and the voltage level of the audio signal SA is greater than the threshold value TH, the alarm unit 110 outputs a first alarm signal to indicate that the volume of the audio signal SA is above a safe level and the audio output device 10 is performing a volume adjustment process according to the control signal SC.

In brief, when the audio output device 10 connects to the audio generating apparatus, the audio output device 10 has the volume control permission. The audio output device 10 adjusts the audio signal according to the voltage level of the audio signal and outputs related alarm signals for indicating whether the volume exceeds the safe level and whether the volume adjustment process is performed. As a result, a user will not listen to the audio signal too loud and can be immediately informed of abnormal situations of the audio signal when using the audio output device 10.

On the other hand, when the processing unit 106 determines that the voltage level of the audio signal SA is less than or equal to the threshold value TH (e.g. in Step 206 and/or Step 212), this means that the volume of the audio signal does not exceed a safe level. Therefore, the alarm unit 110 outputs a second alarm signal according to the control signal SC, to indicate that the current volume of the audio signal does not exceed the safe limit (Step 216) and the audio output unit 112 plays the audio signal SA (Step 218). Besides, in Step 216, since the volume of the audio signal does not exceed the safe limit, the alarm unit 110 outputs the second alarm signal, releases the volume control permission and gives the volume control permission to the user. Therefore, the user can adjust the volume of the audio signal at will. For example, the user can control the audio generating apparatus to adjust the volume of the audio signal SA being provided for the audio output unit 112.

In an embodiment, after the determination process of Step 206 and the adjustment process of Step 208, the audio output device 10 may release the volume control permission and continue to monitor the voltage level of the audio signal SA. In Step 212, the voltage detection unit 104 continues to detect voltage levels of the audio signal SA and accordingly generates the detection result. The processing unit 106 continues to compare the voltage level of the audio signal SA with the threshold value TH according to the detection result and accordingly generates the control signal SC.

In Step 214, when the control signal SC indicates that the audio output device 10 does not has the volume control permission, e.g. the audio output device 10 has released the volume control permission, and the voltage level of the audio signal SA is greater than the threshold value TH, the alarm unit 110 outputs a third alarm signal to indicate that the volume exceeds the safe level. In other words, since the audio output device 10 has released the volume control permission, the audio output device 10 can indicate that the volume exceeds the safe level via the alarm unit 110 (Step 214). Moreover, the audio output unit 112 plays the audio signal SA directly (Step 218). In Step 218, since the audio output device 10 has released the volume control permission or does not has the volume control permission, the volume control permission can be granted to the user, so that the user can adjust the volume of the audio signal without restraint. For example, the user can control the audio generating apparatus to adjust the volume of the audio signal SA being provided for the audio output unit 112.

In brief, when the audio output device 10 has released the volume control permission or does not has the volume control permission, the audio output device 10 continues to monitor the voltage level of the audio signal SA and outputs related alarm signals for indicating the current status of the volume of the audio signal.

For example, if the audio output device 10 is a headphone (or a pair of headphones) and the audio generating apparatus is a portable audio player. The audio output device 10 has the volume control permission when receiving the audio signal. When an audio plug of the audio output device 10 connects to an audio jack of the audio generating apparatus, the audio output device 10 receives the audio signal SA from the audio generating apparatus. The voltage detection unit 104 detects a voltage level of the audio signal SA and accordingly generates a detection result. The processing unit 106 determines whether the voltage level of the audio signal SA is greater than a threshold value TH according to the detection result detected by the voltage detection unit 104, and generates a control signal SC accordingly. When the control signal SC indicates that the audio output device 10 has the volume control permission and the voltage level of the audio signal SA is greater than the threshold value TH, the volume adjustment unit 108 decreases voltage level of the audio signal SA to generate an adjusted audio signal SA'. Under such a situation, the audio output unit 112 plays the adjusted audio signal SA' and the alarm unit 110 may use light emitting diodes (LEDs) to produce yellow light for indicating that the current volume of the audio signal exceeds the safe limit and the audio output device 10 is performing a volume adjustment process. When the processing unit 106 determines that the voltage level of the audio signal SA is less than or equal to the threshold value TH, this means that the volume of the audio signal does not exceed the safe limit. Under such a situation, the audio output unit 112 plays the audio signal SA and the alarm unit 110 may use LEDs to produce green light for indicating that the current volume of the audio signal does not exceed the safe limit. Therefore, when the user sees the green light generated by the alarm unit 110, the user can adjust the volume of the audio signal SA For example, the user can control the audio generating apparatus to adjust the volume of the audio signal SA provided for the audio output unit 112. Moreover, the audio output device 10 may release the volume control permission and continue to monitor the voltage level of the audio signal SA. When the control signal SC indicates that the audio output device 10 has released the volume control permission and the voltage level of the audio signal SA is greater than the threshold value TH, the alarm unit 110 may use LEDs to produce red light for indicate that the volume exceeds the safe limit.

Therefore, when having the volume control permission, the audio output device 10 adjusts the audio signal SA to make the volume of the audio signal fall within a safe level range according to voltage level of the audio signal SA. Moreover, the audio output device 10 uses LED signals to indicate that whether the current volume of the audio signal exceeds the safe limit. When the user sees the yellow light generated by the alarm unit 110, this indicates that the current volume of the audio signal exceeds the safe limit and the audio output device 10 is performing a volume adjustment process. When the user sees the red light generated by the alarm unit 110, this indicates that the current volume of the audio signal exceeds the safe limit and the audio output device 10 does not perform a volume adjustment process. As such, the user can adjust the volume of the audio signal to turn down the volume. When the user sees the green light generated by the alarm unit 110, this indicates that the current volume of the audio signal does exceed the safe limit. The user can adjust the volume of the audio signal without restraint.

The audio output device 10 of FIG. 1 is an exemplary embodiment of the invention, and those skilled in the art can make alternations and modifications accordingly. For example, the audio generating apparatus can be a wearable device, a head-mounted device, a smart phone, a notebook, a portable audio player or any other device which can generate audio signals. The alarm unit 110 can be a light emitting device (e.g. an LED device), a speaker or a vibration unit, for informing the user through light, sound, vibration or other alarm signal.

In summary, when the audio output device of the invention connects to an audio generating apparatus, the audio output device can detect the voltage level of the audio signal and control the volume of the audio signal to fall within an appropriate level range for preventing hearing loss. Moreover, the audio output device can output related alarm signals to indicate that whether the volume of the audio signal exceeds the safe level and whether the volume adjustment process is performed, thus notifying abnormal situation of the audio signal for the user immediately.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio output device, comprising:
 a voltage detection unit for detecting an instant voltage level of an audio signal to generate a detection result;
 a processing unit for determining whether the instant voltage level of the audio signal is greater than a threshold value according to the detection result and accordingly generating a control signal;
 a volume adjustment unit for adjusting the audio signal to generate an adjusted audio signal according to the control signal;
 an alarm unit for outputting a first alarm signal to implement an alarm function according to the control signal; and
 an audio output unit for playing the adjusted audio signal according to the control signal.

2. The audio output device of claim 1, further comprising:
 an audio input unit for receiving the audio signal when the audio output device is connected to an audio generating apparatus.

3. The audio output device of claim 1, wherein when the control signal indicates that the audio output device has volume control permission and the instant voltage level of the audio signal is greater than the threshold value, the volume adjustment unit decreases the instant voltage level of the audio signal to generate the adjusted audio signal and the audio output unit plays the adjusted audio signal.

4. The audio output device of claim 1, wherein when the control signal indicates that the audio output device has volume control permission and the instant voltage level of the audio signal is greater than the threshold value, the alarm unit outputs the first alarm signal to indicate that volume of the audio signal exceeds a safe limit and the audio output device is implementing a volume adjustment process.

5. The audio output device of claim 1, wherein when the control signal indicates that the instant voltage level of the audio signal is less than or equal to the threshold value, the alarm unit outputs a second alarm signal to indicate that the instant voltage level of the audio signal does not exceed a safe limit and the audio output unit plays the audio signal.

6. The audio output device of claim 1, wherein the audio output device releases volume control permission and when the control signal indicates that the instant voltage level of the audio signal is greater than the threshold value, the alarm unit outputs a third alarm signal to indicate that the instant voltage level of the audio signal exceeds a safe limit and the audio output unit plays the audio signal.

7. The audio output device of claim 1, wherein the volume adjustment unit comprises:
 a variable resistor unit for adjusting an independence value according to the control signal so as to adjust the audio signal to the adjusted audio signal.

8. A control method for an audio output device, comprising:
 receiving an audio signal from an audio generating apparatus when the audio output device is connected to the audio generating apparatus;
 detecting an instant voltage level of the audio signal to generate a detection result;
 determining whether the instant voltage level of the audio signal is greater than a threshold value according to the detection result and accordingly generating a control signal;
 adjusting the audio signal to generate an adjusted audio signal according to the control signal;
 outputting a first alarm signal to implement an alarm function according to the control signal; and
 playing the adjusted audio signal according to the control signal.

9. The control method of claim 8, wherein when the control signal indicates that the audio output device has volume control permission and the instant voltage level of the audio signal is greater than the threshold value, decreasing the instant voltage level of the audio signal to generate the adjusted audio signal and playing the adjusted audio signal.

10. The control method of claim 8, wherein when the control signal indicates that the audio output device has volume control permission and the instant voltage level of the audio signal is greater than the threshold value, outputting the first alarm signal to indicate that volume of the audio signal exceeds a safe limit and the audio output device is implementing a volume adjustment process.

11. The control method of claim 8, wherein when the control signal indicates that the instant voltage level of the audio signal is less than or equal to the threshold value, outputting a second alarm signal to indicate that the instant voltage level of the audio signal does not exceed a safe limit and playing the audio signal.

12. The control method of claim 8, wherein when the control signal indicates that the audio output device releases volume control permission and the instant voltage level of the audio signal is greater than the threshold value, outputting a third alarm signal to indicate that the instant voltage level of the audio signal exceeds a safe limit and playing the audio signal.

13. The control method of claim 8, further comprising:
   adjusting an independence value of a variable resistor unit according to the control signal so as to adjust the audio signal to the adjusted audio signal.

\* \* \* \* \*